United States Patent
Strader et al.

(10) Patent No.: US 10,600,714 B2
(45) Date of Patent: *Mar. 24, 2020

(54) METHODS FOR ESTABLISHING THERMAL JOINTS BETWEEN HEAT SPREADERS OR LIDS AND HEAT SOURCES

(71) Applicant: Laird Technologies, Inc., Chesterfield, MO (US)

(72) Inventors: Jason L. Strader, Cleveland, OH (US); Richard F. Hill, Parkman, OH (US)

(73) Assignee: Laird Technologies, Inc., Chesterfield, MO (US)

(*) Notice: Subject to any disclaimer, the term of this patent is extended or adjusted under 35 U.S.C. 154(b) by 0 days.

This patent is subject to a terminal disclaimer.

(21) Appl. No.: 16/529,063

(22) Filed: Aug. 1, 2019

(65) Prior Publication Data

US 2019/0371697 A1    Dec. 5, 2019

Related U.S. Application Data

(63) Continuation of application No. 14/294,973, filed on Jun. 3, 2014, now Pat. No. 10,373,891, which is a
(Continued)

(51) Int. Cl.
*H01L 23/42* (2006.01)
*H01L 23/367* (2006.01)
(Continued)

(52) U.S. Cl.
CPC .......... *H01L 23/3672* (2013.01); *B23P 15/26* (2013.01); *H01L 23/42* (2013.01);
(Continued)

(58) Field of Classification Search
CPC ..... H01L 2924/0132; H01L 2924/0002; H01L 2924/00; H01L 2924/01049; H01L 2924/0105; H01L 2924/16152
See application file for complete search history.

(56) References Cited

U.S. PATENT DOCUMENTS 4,299,715 A    11/1981  Whitfield et al.
4,466,483 A    8/1984   Whitfield et al.
(Continued)

FOREIGN PATENT DOCUMENTS

DE    102008031297 A1    1/2010
EP    1067164 A1          1/2001
(Continued)

OTHER PUBLICATIONS

"Choosing the Right Thermal Interface Material"; Solid State Technology; http://electroiq.com/blog/articles/2005/03/choosing-the-right-thermal-interface-material/; 2005; 6 pgs.
(Continued)

*Primary Examiner* — Jaehwan Oh
(74) *Attorney, Agent, or Firm* — Harness, Dickey & Pierce, P.L.C.; Anthony G. Fussner

(57) ABSTRACT

According to various aspects, exemplary embodiments are disclosed of thermal interface materials, electronic devices, and methods for establishing thermal joints between heat spreaders or lids and heat sources. In exemplary embodiments, a method of establishing a thermal joint for conducting heat between a heat spreader and a heat source of an electronic device generally includes positioning a thermal interface material (TIM1) between the heat spreader and the heat source.

20 Claims, 2 Drawing Sheets

Related U.S. Application Data continuation-in-part of application No. 13/918,824, filed on Jun. 14, 2013, now abandoned.

(60) Provisional application No. 61/881,823, filed on Sep. 24, 2013.

(51) Int. Cl.
*H01L 23/427* (2006.01)
*B23P 15/26* (2006.01)

(52) U.S. Cl.
CPC .. *H01L 23/427* (2013.01); *H01L 2224/32245* (2013.01); *H01L 2924/0002* (2013.01); *H01L 2924/15312* (2013.01); *H01L 2924/16152* (2013.01)

(56) References Cited

U.S. PATENT DOCUMENTS

| | | | |
|---|---|---|---|
| 4,473,113 | A | 9/1984 | Whitfield et al. |
| 4,607,277 | A | 8/1986 | Hassan et al. |
| 5,552,635 | A | 9/1996 | Kim et al. |
| 5,672,297 | A * | 9/1997 | Soane ............... H01B 1/20 252/500 |
| 5,930,893 | A | 8/1999 | Eaton |
| 6,286,212 | B1 | 9/2001 | Eaton |
| 6,391,442 | B1 | 5/2002 | Duvall et al. |
| 6,496,373 | B1 | 12/2002 | Chung |
| 6,597,575 | B1 | 7/2003 | Matayabas, Jr. et al. |
| 6,651,331 | B2 | 11/2003 | Eaton |
| 6,815,486 | B2 | 11/2004 | Bhagwagar et al. |
| 6,940,721 | B2 | 9/2005 | Hill |
| 7,078,109 | B2 * | 7/2006 | Hill ............... H01L 23/4275 228/179.1 |
| 7,147,367 | B2 | 12/2006 | Balian et al. |
| 7,369,411 | B2 * | 5/2008 | Hill ............... H01L 23/4275 165/185 |
| 7,682,690 | B2 * | 3/2010 | Bunyan ............ C09K 5/063 428/323 |
| 7,800,908 | B2 | 9/2010 | Schulz-Harder et al. |
| 8,053,284 | B2 * | 11/2011 | Iruvanti ............ H01L 23/10 257/713 |
| 2003/0153667 | A1 | 8/2003 | Jayaraman et al. |
| 2003/0227959 | A1 | 12/2003 | Balian et al. |
| 2004/0094293 | A1 | 5/2004 | Mita et al. |
| 2005/0072334 | A1 | 4/2005 | Czubarow et al. |
| 2006/0060988 | A1 | 3/2006 | Edwards |
| 2007/0241303 | A1 | 10/2007 | Zhong et al. |
| 2008/0042264 | A1 | 2/2008 | Colgan et al. |
| 2008/0063879 | A1 | 3/2008 | Lin et al. |
| 2011/0042784 | A1 | 2/2011 | Edwards et al. |
| 2011/0176279 | A1 | 7/2011 | Zhao et al. |
| 2011/0204280 | A1 | 8/2011 | Bruzda |
| 2011/0308782 | A1 | 12/2011 | Merrill et al. |
| 2012/0061135 | A1 | 3/2012 | Hill et al. |
| 2014/0077349 | A1 | 3/2014 | Higgins, III |
| 2014/0367847 | A1 | 12/2014 | Strader et al. |
| 2014/0368992 | A1 | 12/2014 | Strader et al. |

FOREIGN PATENT DOCUMENTS

| | | | |
|---|---|---|---|
| EP | 1163483 | A1 | 12/2001 |
| EP | 2814057 | A3 | 6/2015 |
| JP | 2002-532914 | A | 10/2002 |
| JP | 2004-146799 | A | 5/2004 |
| JP | 2006-527912 | A | 12/2006 |
| JP | 2010235953 | A | 10/2010 |
| JP | 2011-40749 | | 2/2011 |
| KR | 10-0987916 | B1 | 10/2010 |
| KR | 10-2011-0017341 | | 2/2011 |
| WO | WO-97/41599 | A1 | 11/1997 |
| WO | WO-00/36893 | A2 | 6/2000 |
| WO | WO-00/58683 | A1 | 10/2000 |
| WO | WO-02/059965 | A1 | 8/2002 |
| WO | WO-2005/013362 | A1 | 2/2005 |
| WO | WO-2012/010395 | A2 | 1/2012 |
| WO | WO-2012/095757 | A1 | 7/2012 |
| WO | WO-2014149106 | A1 | 9/2014 |

OTHER PUBLICATIONS

Chinese Office Action dated Aug. 1, 2016 for Chinese Application No. 201410427808.8 filed Jun. 13, 2014 (published as CN104241223 on Dec. 24, 2014) which claims priority to the instant application; 11 pages.

Datasheet of TflexTM 300 from Laird Technologies, Inc. Dec. 31, 2011, http://www.lairdtech.com/brandworld/library/THR-DS-Tflex%20300%200612.pdf., 2 pages.

Datasheet of TflexTM 600 from Laird Technologies, Inc. Dec. 31, 2010. http://www.lairdtech.com/brandworld/library/THR-DS-Tflex-600_07_2_14.pdf., 2 pages.

Datasheet of TgreaseTM 880 from Laird Technologies, Inc. Dec. 31, 2010, http://www.lairdtech.com/brandworld/library/THR-DS-Tgrease%20880%200710.pdf., 2 pages.

Datasheet of TpcmTM 580 from Laird Technologies, Inc. Dec. 31, 2012, http://www.lairdtech.com/brandworld/library/THR-DS-TPCM580%201112.pdf.

Datasheet of TpliTM 200 from Laird Technologies, Inc. Dec. 31, 2010, http://www.lairdtech.com/brandworld/library/THR-DS-Tpli200-0710.pdf., 2 pages.

Extended European Search Report dated May 15, 2015 for European application No. 14171775.1 filed Jun. 10, 2014 (published as 2814057 on Dec. 17, 2014) which claims priority to the instant application, 8 pages.

Final Office Action dated Aug. 23, 2016 for U.S. Appl. No. 14/294,973, filed Jun. 3, 2014 which names the same inventor and Assignee/Applicant but is not related through a priority claim, 20 pages.

International Search Report and Written Opinion for Singapore application No. 10201602892U which names the same inventor and Assignee/Applicant but is not related through a priority claim; 8 pages.

Maleimide; http://en.wikipedia.org/wiki/Maleimide; May 2, 2014; 3 pages.

New Self-Healing Plastics Developed; http://www.kit.edu/kit/english/pi_2014_14853.php; May 2, 2014, 2 pages.

New self-healing plastics developed; http://www.sciencedaily.com/releases/2014/04/14041191415.htm; May 2, 2014; 1 page.

Non-final Office Action dated Aug. 18, 2016 for U.S. Appl. No. 13/918,824, filed Jun. 14, 2013 which names the same inventors and Assignee/Applicant but is not related through a priority claim, 32 pages.

Printing Lid & Optical Seal Solutions; <http://www.aitechnology.com/index.php?mact=Printing, cntnt01,output,0&cntnt01url=aHR> Jun. 26, 2014; 4 pages.

Self-healing material; http://en.wikipedia.org/wiki/Self-healing_material; May 2, 2014; 15 pages.

TpcmTM 780 Phase Change Material; Revised Sep. 2012; 2 pages.

Written Opinion and Search Report dated Dec. 6, 2014 for Singapore Application No. 10201403193 filed Jun. 12, 2014 which claims priority to the instant application; 20 pgs.

Written Opinion dated Jun. 22, 2015 for Singapore Application No. 10201403193 filed Jun. 12, 2014 which names the same inventors and assignee but is not related through a priority claim; 11 pages.

Korean Office Action issued for Korean patent application No. 10-2015-7027997 which claims priority to the same parent application as the instant application, dated Jul. 28, 2017, 8 pages.

Korean Office Action issued for Korean patent application No. 10-2016-0046872 which claims priority to the same parent application as the instant application, dated Jul. 28, 2017, 8 pages.

Nonfinal Office action issued for U.S. Appl. No. 14/294,973, filed Jun. 3, 2014, dated Jul. 14, 2017 (published as US 2014/0367847 on Dec. 18, 2014), which names the same inventor and Assignee/Applicant as the instant application but is not related through a priority claim, 19 pages.

(56) References Cited

OTHER PUBLICATIONS

Japanese Office Action dated Aug. 25, 2015 issued for Japanese application No. 2014-121485 which claims priority to the same application as the instant application; 11 pages.

* cited by examiner

METHODS FOR ESTABLISHING THERMAL JOINTS BETWEEN HEAT SPREADERS OR LIDS AND HEAT SOURCES

CROSS-REFERENCE TO RELATED APPLICATIONS

This application is a continuation of U.S. patent application Ser. No. 14/294,973 filed Jun. 3, 2014, which published as US2014/0367847 on Dec. 18, 2014 and is issuing as U.S. Pat. No. 10,373,891 on Aug. 6, 2019.

U.S. patent application Ser. No. 14/294,973 claims the benefit and priority of U.S. Provisional Patent Application No. 61/881,823 filed Sep. 24, 2013.

U.S. patent application Ser. No. 14/294,973 is a continuation-in-part of abandoned U.S. patent application Ser. No. 13/918,824 filed Jun. 14, 2013, which published as US2014/0368992 on Dec. 18, 2014.

The entire disclosures of the above applications are incorporated herein by reference.

FIELD

The present disclosure generally relates to thermal interface materials (TIM1), and more particularly (but not exclusively) to methods for establishing thermal joints between heat spreaders or lids and heat sources.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor. Most especially in the cases of phase changes and thermal greases, a significant gap is not required and the purpose of the thermal interface material may be just to fill in the surface irregularities between contacting surfaces. In some devices, an electrical insulator may also be placed between the electronic component and the heat sink, in many cases this is the thermal interface material itself.

SUMMARY

This section provides a general summary of the disclosure, and is not a comprehensive disclosure of its full scope or all of its features.

According to various aspects, exemplary embodiments are disclosed of methods for establishing thermal joints between heat spreaders or lids and heat sources. Also disclosed are thermal interface materials and electronic devices including the same.

In exemplary embodiments, a method of establishing a thermal joint for conducting heat between a heat spreader and a heat source of an electronic device generally includes positioning a thermal interface material (TIM1) between the heat spreader and the heat source. In another exemplary embodiment, a method generally includes positioning a thermal interface material (TIM1) between a heat spreader and a heat source of an electronic device prior to curing an adhesive for attaching the heat spreader to the electronic device. In a further exemplary embodiment, an electronic device generally includes a lid and a semiconductor device having a normal operating temperature range. A thermal interface material (TIM1) establishes a thermal joint between the lid and the semiconductor device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
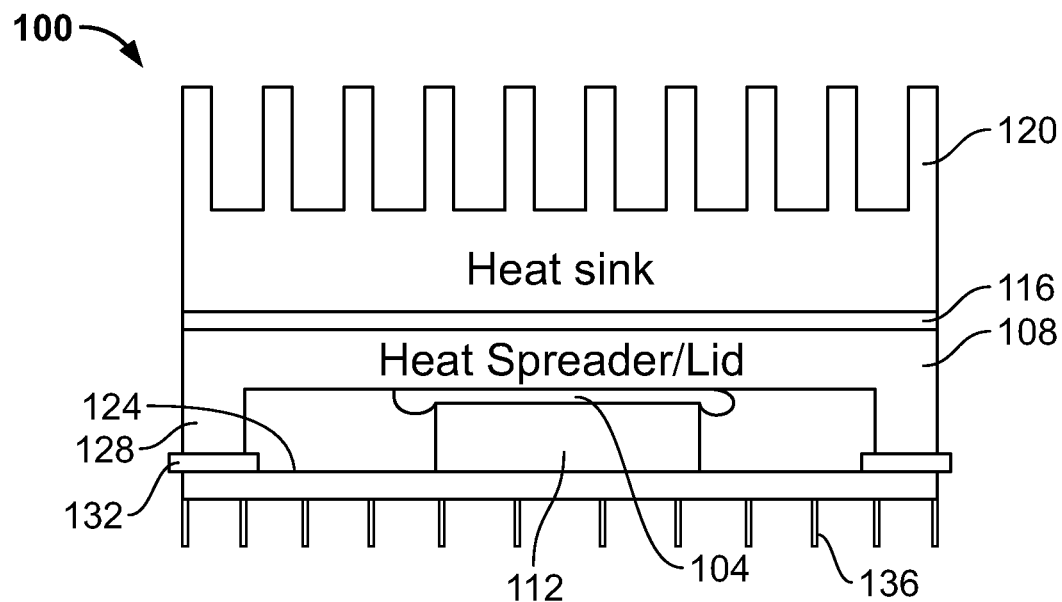
FIG. 1 is a cross-sectional view of an electronic device showing a thermal interface material (TIM1) positioned between a heat spreader (e.g., an integrated heat spreader (IHS), a lid, etc.) and a heat source (e.g., one or more heat generating components, central processing unit (CPU), die, semiconductor device, etc.) according to exemplary embodiments.

Example embodiments will now be described more fully with reference to the accompanying drawings.

Heat spreaders are commonly used to spread the heat from one or more heat generating components such that the heat is not concentrated in a small area when transferred to a heat sink. An integrated heat spreader (IHS) is a type of heat spreader that may be used to spread the heat generated by operation of a central processing unit (CPU) or processor die. An integrated heat spreader or lid (e.g., a lid of an integrated circuit (IC) package, etc.) is typically a thermally-conductive metal (e.g., copper, etc.) plate that rests on top of the CPU or processor die.

Heat spreaders are also commonly used (e.g., as a lid, etc.) to protect chips or board-mounted electronic components often in conjunction with a sealed package. Accordingly, a heat spreader may also be referred to herein as a lid and vice versa.

A first thermal interface material or layer(s) (referred to as TIM1) may be used between an integrated heat spreader or lid and a heat source to reduce hot spots and generally reduce the temperature of the heat generating components or device. A second thermal interface material or layer(s) (referred to as TIM2) may be used between the integrated heat spreader (or lid) and the heat sink to increase thermal transfer efficiency from the heat spreader to the heat sink.

The heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, the heat source may comprise any component or device that has a higher temperature than the heat spreader or lid during operation or otherwise provides or transfer heat to the lid or heat spreader regardless of whether the heat is generated by the heat source or merely transferred through or via the heat source.

Conventional polymeric thermal interface materials may be used as the TIM1. But the inventors hereof have recognized that currently used polymeric TIM1 materials are typically cure in place silicone gel materials that are required to be shipped and stored frozen. They also have short pot lives upon opening, short shelf lives, and require special dispensing equipment to apply. After recognizing these drawbacks, the inventors hereof have developed and disclose herein exemplary embodiments that eliminate, avoid or at least reduce these aforementioned drawbacks associated with conventional polymeric TIM1 materials.

As disclosed herein, exemplary embodiments include a TIM1 in the form of a pad of thermoplastic material (e.g., thermoplastic phase change material, etc.) that may or may not be naturally tacky. In some embodiments, the TIM1 may have a softening temperature (e.g., a melting temperature, state transition or phase change temperature, etc.) higher than a normal operating temperature of a heat source such as a CPU (e.g., normal operating temperature from about 60° C. to 100° C. or from about 30° C. to 40° C., etc.). In these exemplary embodiments, the pad of thermoplastic material will soften or melt once (e.g., during an adhesive curing stage, during an initial operation of the CPU, etc.) and then solidify. Thereafter, the pad of thermoplastic material may be used below its softening or melting temperature and remain solidified. In other exemplary embodiments, the TIM1 may have a softening less than or within an normal operating temperature range of a heat source such as a CPU.

In some exemplary embodiments, the TIM1 comprises a thermoplastic phase change material having a softening temperature (e.g., melting point or phase change temperature, etc.) that falls within a range from about 75° C. to about 200° C. or about 125° C. to about 175° C., etc. Or, for example, the TIM1 may have a softening or melting temperature of about 40° C., 50° C., 75° C., etc. The TIM1 may have a thermal conductivity of about 0.3 Watts per meter per Kelvin (W/mK) or more, 3 W/mk or more, 5 W/mk or more, etc., which thermal conductivity may be enhanced by incorporating thermally-conductive filler into the thermoplastic material. In exemplary embodiments, the TIM1 may comprise a low melting alloy having a melting temperature of about 160° C. or less.

Conventionally, it is common for an integrated heat spreader (IHS) or lid to be attached to a CPU and held in place via an adhesive along the outside edges or perimeter rim of the IHS. The adhesive may be cured under pressure (e.g., at a pressure that falls within a range of about 5 pounds per square inch (psi) to about 100 psi or from about 10 psi to about 50 psi, etc.) at a temperature (e.g., a temperature within a range from about 75° C. to about 200° C. or from about 125° C. to about 175° C., a temperature of about 40° C., 50° C., 75° C., etc.). In exemplary embodiments disclosed herein, the TIM1 material has a softening temperature (e.g., melting temperature, etc.) within a range from about 75° C. to about 200° C. or from about 125 ° C. to about 175° C., or a temperature of about 40° C., 50° C., 75° C., etc. This allows the TIM1 to soften (e.g., melt, change phase, become flowable, etc.) and flow during the adhesive curing step. In these exemplary embodiments, the TIM1 (e.g., a thermoplastic pad, etc.) may be placed between the IHS (or lid) and a CPU prior to the adhesive curing step. The thermoplastic pad softens, melts, or becomes flowable such that it flows to a thin bond line (e.g., having a thickness of about 10 mils or less, less than about 5 mils, or from about 1 to about 3 mils, etc.) while under pressure during the adhesive curing step, thereby resulting in a low thermal resistance (e.g., about 0.2° C. cm$^2$/W, less than 0.15° C. cm$^2$/W, etc.) joint or interface between the IHS and CPU. In alternative embodiments, the adhesive may not necessarily be cured under pressure. For example, mechanical stops may be used, and pressure may be used to squeeze the adhesive and the TIM1 to the desired degree. Then, the adhesive may be cured at a temperature where the curing is not under pressure. In still other embodiments, an integrated heat spreader (or lid) and TIM1 may also be attached and used with a CPU or other electronic device without using any adhesive, such as by using gaskets and mechanical fasteners.

Exemplary embodiments disclosed herein may provide one or more (but not necessarily any or all) of the following advantages. For example, the TIM1 may be pre-applied to the integrated heat spreader or lid, thereby reducing the number of assembly steps. The TIM1 may be naturally tacky such that when pre-applied it will adhere to the heat spreader or lid without any additional adhesive needed (although adhesives could also be used). The heat spreader or lid may be preheated, and then the TIM1 may be pre-applied to the warm heat spreader or lid. The TIM1 may be silicone-free, e.g., not have any detectable silicone, be entirely free of silicone, etc. The TIM1 may be easy to rework. The TIM1 may be stored at room temperature, such that it doesn't have a pot life, does not have to be warmed up before use, and has no moisture contamination.

A TIM1 disclosed herein may increase shelf life from 6 months or less for current products to 12 months or more. Exemplary embodiments also allow for the elimination of the need to ship and store material frozen, the elimination of pot life, and/or the elimination of the need for dispensing equipment providing additional floor space, while also providing high thermal conductivity and low thermal resistance.

During thermal cycling, a cured TIM1 may delaminate from the edges of the CPU or IHS. If this delamination occurs, the interfacial contact resistance and thermal resistance of the TIM1 will increase greatly. This, in turn, may result in overheating of the CPU. To avoid this delamination and CPU overheating problem, exemplary embodiments disclosed herein include a TIM1 (e.g., thermoplastic, etc.). If the TIM1 delaminates during thermal cycling, the CPU may then start to heat up due to the increased interfacial contact resistance and thermal resistance associated with the delaminated TIM1. Due to the heat from the operating CPU, the TIM1 will soften, which reduces the contact resistance and rewets the surfaces thereby resulting in reestablishment or restoration of the delaminated joint and maintaining lower CPU temperatures.

With reference now to the figures, FIG. 1 illustrates an exemplary embodiment of an electronic device 100 having a TIM1 or thermal interface material 104 embodying one or more aspects of the present disclosure. As shown in FIG. 1, the TIM1 or thermal interface material 104 is positioned between a heat spreader or lid 108 and a heat source 112, which may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). A TIM2 or thermal interface material 116 is positioned between a heat sink 120 and the heat spreader or lid 108.

By way of example, the heat source 112 may comprise a central processing unit (CPU) or processor die mounted on a printed circuit board (PCB) 124. The PCB 124 may be made of FR4 (flame retardant fiberglass reinforced epoxy laminates) or other suitable material. Also in this example, the heat spreader or lid 108 is an integrated heat spreader (IHS), which may comprise metal or other thermally-conductive structure. The heat spreader or lid 108 includes a perimeter ridge, flange, or sidewall portions 128. Adhesive 132 is applied to and along the perimeter ridge 128 for attaching the heat spreader or lid 108 to the PCB 124. The perimeter ridge 128 may thus protrude sufficiently downward to extend around the silicone die on the PCB 124 and thereby allow contact between the adhesive 132 on the perimeter ridge 128 and the PCB 124. Advantageously, adhesively attaching the heat spreader or lid 108 to the PCB 124 may also help stiffen the package, which is attached to the base PCB.

Also shown in FIG. 1 are pin connectors 136. The heat sink 120 generally includes a base from which outwardly protrude a series of fins. Alternative embodiments may include a TIM1 being used with different electronic devices besides what is shown in FIG. 1, different heat generating components besides a CPU or processor die, different heat spreaders, and/or different heat sinks. Accordingly, aspects of the present disclosure should not be limited to use with any single type of electronic device as exemplary embodiments may include a TIM1 that is usable with any of a wide range of electronic devices, heat sources, and heat spreaders.

The TIM2 or thermal interface material 116 may comprise any of a wide range of thermal interface materials including thermal interface materials from Laird Technologies, Inc. (e.g., Tflex™ 300 series thermal gap filler materials, Tflex™ 600 series thermal gap filler materials, Tpcm™ 580 series phase change materials, Tpli™ 200 series gap fillers, and/or Tgrease™ 880 series thermal greases from Laird Technologies, Inc. of Saint Louis, Mo., etc.).

The TIM1 or thermal interface material 116 may also comprise a wide range of materials, such as phase change and/or thermoplastic thermal interface materials. In some exemplary embodiments, the TIM1 comprises a pad of thermoplastic and/or phase change material having a softening point (e.g., a melting temperature, phase change temperature, etc.) higher than the normal operating temperature of the heat source 112 (e.g., a CPU having a normal operating temperature from about 60° C. to 100° C., etc.). For example, the TIM1 may have a softening temperature of about 120° C., and the normal operating temperature of the CPU or other heat source may be about 115° C. The TIM1 pad will soften or melt once (e.g., during an adhesive curing stage, during an initial operation of the CPU, etc.) and then solidify. Thereafter, the TIM1 pad of thermoplastic and/or phase change material may be used below its softening and/or melting temperature and remain solidified. In some exemplary embodiments, the TIM1 may comprise a thermal interface material including a thermally reversible gel as disclosed hereinafter and in U.S. Patent Application Publication No. US 2011/0204280, the entire disclosure of which is incorporated herein by reference in its entirety.

In other exemplary embodiments, the TIM1 may comprise a pad of thermoplastic and/or phase change material having a softening point (e.g., a melting temperature, phase change temperature, etc.) that is less than or within a normal operating temperature range of the heat source 112 (e.g., CPU having a normal operating temperature range from about 60° C. to 100° C., etc.). IceKap™ thermally-conductive elastomeric oil-gel based interface material from Laird Technologies, Inc. is an example of a TIM1 that may be used in exemplary embodiments.

Figure 2:
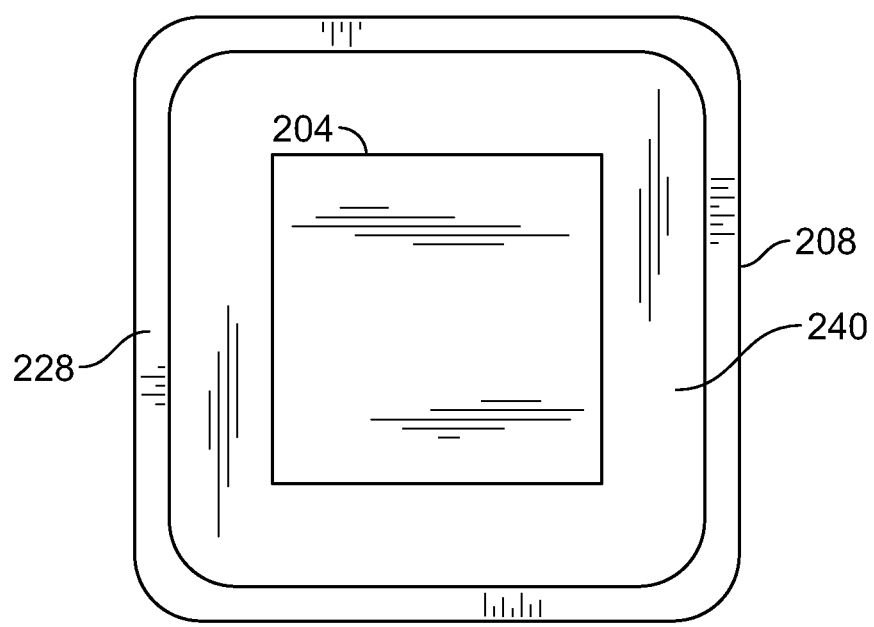
FIG. 2 is a view showing a thermal interface material (TIM1) on a surface of a heat spreader (e.g., an integrated heat spreader (IHS), a lid, etc.) according to exemplary embodiments.

FIG. 2 shows a TIM1 or thermal interface material 204 on a portion 240 of a heat spreader or lid 208. In this example, the heat spreader or lid 208 may be an integrated heat spreader. The heat spreader or lid 208 may be positioned relative to (e.g., on top of, etc.) the heat source such that the TIM1 or thermal interface material 204 is sandwiched between the heat spreader or lid 208 and the heat source, with the TIM1 compressed against the heat source. The heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.).

With continued reference to FIG. 2, the heat spreader or lid 208 includes a perimeter ridge or flange 228 about the generally flat, planar portion 240. Adhesive may be applied to and along the perimeter ridge 228 for attaching the heat spreader or lid 208 to a PCB. The perimeter ridge 228 may thus protrude sufficiently outward from the portion 240 to extend around an electronic component mounted on a PCB and thereby allow contact between the adhesive on the perimeter ridge 228 and the PCB.

Adhesively attaching the heat spreader or lid 208 to the PCB may also help stiffen the package, which is attached to the base PCB. The package itself typically includes a mini PCB with a chip and the heat spreader or lid 208.

Alternative embodiments may include other ways or means of attaching the lid or heat spreader to the PCB. For example, adhesive may be disposed along less than all sides of the perimeter of the lid or heat spreader. Or, for example, the lid or heat spreader may be a flat plate without any perimeter ridge or sidewalls. In which case, the adhesive itself may bridge the gap between the flat lid and the PCB. Accordingly, aspects of the present disclosure are not limited to any particular attachment method between the lid or heat spreader and the PCB.

Also disclosed herein are exemplary embodiments of methods relating to or establishing of a thermal joint, interface, or pathway for conducting heat between a heat spreader and a heat source (e.g., one or more heat generating components, etc.) using a phase change and/or thermoplastic thermal interface material (TIM1). In an exemplary embodiment, a method generally includes positioning a thermal interface material (TIM1) (e.g., a free-standing thermoplastic phase change pad, etc.) on a surface of a heat spreader before attachment to an electronic component (e.g., prior to an adhesive curing process, etc.). In this example, the TIM1 may have a softening temperature (e.g., melting temperature, phase change temperature, temperature at which the material hardness decreases, etc.) higher than a normal operating temperature of the electronic component. Or, for example, the TIM1 may have a softening temperature that is less than or within a normal operating temperature range of the electronic component. The softening temperature of the TIM1 may be low enough such that the TIM1 will soften, melt, and flow during an adhesive curing process (e.g., when an adhesive is cured under pressure at a temperature of between 100° C. to 200° C. or from 125° C. to 175° C., etc.). During the adhesive curing process, the TIM1 will flow to a thin bond line whereby the TIM1 creates a relatively short heat path with low thermal resistance between the heat spreader and the electronic component.

After the curing process, the TIM1 solidifies and forms a low thermal resistance thermal joint/pathway between the electronic component and the heat spreader. In some exemplary embodiments, the TIM1 has a softening or melting temperature above the normal operating temperature of the electronic component, such that the electrical component will not reach a high enough operating temperature to deform, soften, or melt the TIM1. The solidified thermal joint precludes the electronic component from heating beyond its normal operating temperature upon subsequent operation. The TIM1 may be selected so as to deform only during the initial adhesive curing phase so as to avoid problems of liquefaction.

In another exemplary embodiment, a method generally includes attaching a heat spreader having a TIM1 thereon to an electronic component (e.g., CPU, etc.) by curing an adhesive. The TIM1 melts/softens and flows to a thin bond line while under pressure during the curing process, which results in a thermal joint/pathway having low thermal resistance between the electronic component and the heat spreader. The TIM1 may have a softening point less than, within, or higher than a normal operating temperature range of the electronic component.

In some exemplary embodiments, the method may further include establishing a thermal joint between the heat spreader and a heat sink by positioning a thermal interface material (TIM2) between the heat sink and the heat spreader. A thermally conductive heat path may then be established from the heat source through the TIM1, the heat spreader, and the TIM2 to the heat sink such that heat from the heat source (e.g., generated by one or more heat generating components, etc.) is transferrable to the heat sink via the TIM1, the heat spreader, and the TIM2. If the heat source is a semiconductor device, for example, then the semiconductor device would be in effective thermal communication with the heat sink via the TIM1, the heat spreader, and TIM2.

In an alternative exemplary embodiment, the TIM1 may comprise a coating or material that is coated or otherwise applied (e.g., by screen printing, stenciling, etc.) onto a heat spreader or lid. The heat spreader may then be positioned relative to the heat source (e.g., one or more heat generating components, etc.) such that the TIM1 is between the heat spreader and the heat source. The TIM1 is initially in a solid state and may not fill all the resulting voids between the mating surfaces of the heat spreader and heat source. Thus, during initial operation, the thermal path may be an inefficient one. This inefficiency may cause the heat source to reach a temperature above a normal operating temperature range and/or above the softening temperature (e.g., melting temperature, etc.) of the TIM1. For example, one or more heat generating components while operating may heat the TIM1 to or above its softening temperature such that the TIM1 becomes flowable to a thin bond line, and fill the voids between the mating surfaces of the heat source and the heat spreader. This creates an efficient thermal joint having low thermal resistance. In turn, more heat flows from the heat source to the heat spreader such that the temperature is reduced to a normal operating temperature. During this cool down, the TIM1 temperature drops below its softening temperature, which returns the TIM1 to its solid state (e.g., pad, etc.) while the previously established thermal joint is maintained. Upon subsequent operation, the normal operating temperature will not be exceeded as the previously established thermal joint conducts heat from the heat source to the heat spreader. The TIM1 will not melt or flow as the normal operating temperature remains below the temperature at which TIM1 melts or becomes flowable. As the TIM1 does not melt and flow, the TIM1 may thus maintain the thermal conductivity of its solid state, which may be higher than the thermal conductivity of its liquid state. Moreover, as the TIM1 will not flow away from the thermal joint, the joint integrity is maintained.

In some exemplary embodiments, the TIM1 may comprise a thermal interface material including a thermally reversible gel as disclosed in U.S. Patent Application Publication No. US 2011/0204280, the entire disclosure of which is incorporated herein by reference in its entirety. In an exemplary embodiment, the TIM1 includes at least one thermally conductive filler (e.g., boron nitride, alumina, and zinc oxide, etc.) in a thermally reversible gel (e.g., oil gel, etc.). The thermally reversible gel comprises a gelling agent and an oil and/or solvent. The oil and/or solvent may comprise paraffinic oil and/or solvent. The gelling agent may comprise a thermoplastic material. The thermoplastic material may comprise a styrenic block copolymer. The thermal interface material may be an oil gel that includes paraffinic oil and di-block and/or tri-block styrenic copolymers. The TIM1 may include naphthenic oils and solvents and/or paraffinic oils and solvents (e.g., isopars, a high temperature stable oil and/or solvent, etc.). Thermoplastic materials (e.g., thermoplastic elastomers, etc.) may be used for the gelling agent of the oil gel. Suitable thermoplastic materials include block copolymers, such as di-block and tri-block polymers (e.g., di-block and tri-block styrenic polymers, etc.). A di-block containing pad will be relatively soft at room temperature, which tends to be important because most assembly or installation is performed at room temperature and a softer di-block containing pad will advantageously reduce the assembly pressures generated. In some embodiments, the TIM1 may include an oil gel resin system in which the oil gel is formulated to soften at a temperature higher or less than 150 degrees Celsius, such as within a temperature range from about 5 degrees Celsius to about 200 degrees Celsius.

One or more thermally conductive fillers may be added to create a thermally conductive interface material in which one or more thermally conductive fillers will be suspended in, added to, mixed into, etc. the thermally reversible gel. For example, at least one thermally conductive filler may be added to a mixture including gellable fluid and gelling agent before the gellable fluid and gelling agent have gelled or form the thermally reversible gel. As another example, at least one thermally conductive filler may be added to the gellable fluid and then gelling agent may be added to the mixture containing gellable fluid and thermally conductive filler. In yet another example, at least one thermally conductive filler may be added to the gelling agent and then gellable fluid may be added to the mixture containing gelling agent and thermally conductive filler. By way of further example, at least one thermally conductive filler may be added after the gellable fluid and gelling agent have gelled. For example, at least one thermally conductive filler may be added to the gel when the gel may be cooled and be loosely networked such that filler can be added. The amount of thermally conductive filler in the thermally reversible gel may vary in different embodiment. By way of example, some exemplary embodiments of a thermal interface material may include not less than 5 percent but not more than 98 percent by weight of at least one thermally conductive filler.

In exemplary embodiments, the TIM1 may comprise a thermally conductive elastomeric interface material. By way of example, an exemplary embodiment may include a TIM1 having the properties shown in the table immediately below. Additionally, or alternatively, an exemplary embodiment may include a TIM1 having properties such as low contact resistance, easy to flow to thin bond lines, ability to wet multiple surfaces, etc.

| TYPICAL PROPERTY | DESCRIPTION | TEST METHOD |
| --- | --- | --- |
| Color | Grey | Visual |
| Construction/Composition | Non-reinforced film | |
| Specific Gravity, g/cc | 2.51 | Helium Pycnometer |
| Minimum bond line thickness, mm (mils) | 0.025 (1) | Laird Test Method |
| Thermal Conductivity, W/mK | 4.7 | Hot Disk Thermal Constants Analyzer |
| Thermal Resistance, ° C. cm$^2$/W (° C. in$^2$/W) | 0.064 (0.010) | ASTM D5470 |
| Available Thicknesses, mm (mils) | 0.125-0.625 (5-25) | Laird Test Method |
| Room Temperature Hardness, shore 00 | 85 | ASTM D2240 |
| Volume Resistivity, ohm-cm | 10$^{15}$ | ASTM D257 |

For lower power lower operating temperature systems (e.g., 30° C., 40° C., etc.), exemplary embodiments may include a TIM1 that comprises (or has properties similar to) a Tpcm™ 780 phase change thermal interface material from Laird Technologies, Inc. of Saint Louis, Mo., and, accordingly, have been identified by reference to trademarks of Laird Technologies, Inc. Details on these different materials are available at www.lairdtech.com. In such exemplary embodiments, the TIM1 may have the properties shown in the table immediately below. At a temperature of 70° C., the TIM1 may have bond line thickness of about 0.0015 inches at 20 psi, of about 0.001 inches at 40 psi, of about 0.005 inches at 100 psi, etc.

| PROPERTIES | Tpcm™ 780 | TEST METHOD |
| --- | --- | --- |
| Color | Grey | Visual |
| Thickness, inches (mm) | 0.016" (0.406) 0.025" (0.635) | |
| Thickness Tolerance, inches (mm) | ±0.0016" (0.0406) ±0.0025" (0.0635) | |
| Construction & Composition | Non-reinforced film | |
| Specific Gravity, g/cc | 2.48 | Helium Pycnometer |
| Phase Change Softening Range, ° C. | ~45° C. to 70° C. | |
| Thermal Conductivity, W/mK | 5.4 | Hot Disk Thermal Constants Analyzer |
| Hardness (Shore 00) | 85 3 sec @ 21 C. | ASTM D2240 |
| Thermal Resistance 70° C., 345 kPa, ° C.-cm$^2$/W (50 psi, ° C.-in$^2$/W) | 0.025 (0.004) | ASTM D5470 (modified) |
| Outgassing TML | 0.51% | ASTM E595 |
| Outgassing CVCN | 020% | ASTM E595 |

In exemplary embodiments, the TIM1 is engineered so it does not drastically change phase within its operating temperature range. For example, the TIM1 may not significantly soften or change phase until above the normal operating temperature of the component(s) to be cooled. In some exemplary embodiments, the TIM1 may having a softening point (e.g., a melting temperature, phase change temperature, etc.) that is less than or within a normal operating temperature range of the heat source. For example, the TIM1 may have a softening temperature range from about 45° C. to about 70° C., while the heat source may have a normal operating temperature of about 80° C. or above.

Figure 3:
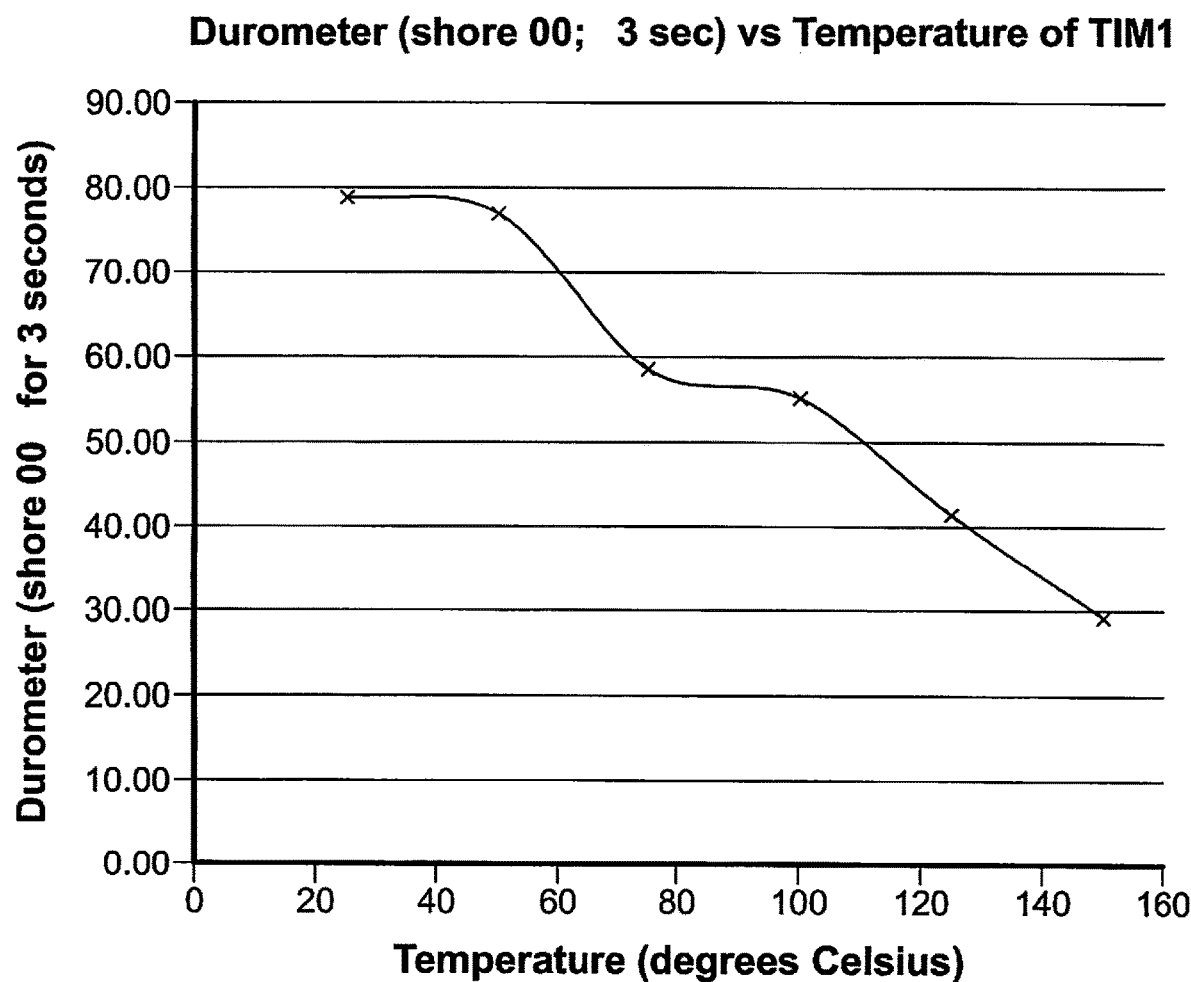
FIG. 3 is a line graph showing durometer test results versus temperature for a TIM1 according to exemplary embodiments.

FIG. 3 is a line graph showing durometer shore 00 test results versus temperature for a TIM1 that may be used in exemplary embodiments. These test results generally show that the TIM1 maintains significant structure within its entire intended use temperature. The test results also show that the tested TIM1 is relatively soft at room temperature and softens with increasing temperature but remain generally solid within the operating temperature range. Immediately below is a table of the two durometer test results (shore 00 for 3 seconds) for the TIM1 and also showing the average of the two tests, which averages were plotted in FIG. 3.

| Temperature ° C. | Test 1 | Test 2 | Average |
| --- | --- | --- | --- |
| 25 | 78.2 | 79.7 | 78.95 |
| 50 | 75.5 | 78.5 | 77.00 |
| 75 | 60.4 | 56.8 | 58.60 |
| 100 | 57.1 | 53.4 | 55.25 |
| 125 | 37.8 | 45.2 | 41.50 |
| 150 | 25.9 | 32.6 | 29.25 |

The tables above list exemplary thermal interface materials that have thermal conductivities of 4.7 and 5.4 W/mK. These thermal conductivities are only examples as other embodiments may include a thermal interface material with a thermal conductivity higher than 5.4 W/mK, less than 4.7 W/mK, or other values. For example, some embodiments may include a thermal interface material having a thermal conductivity higher than air's thermal conductivity of 0.024 W/mK, such as a thermal conductivity of about 0.3 W/mk, of about 3.0 W/mK, or somewhere between 0.3 W/mk and 3.0 W/mk, etc.

A wide range of different thermally conductive fillers may be used in exemplary embodiments. In some exemplary embodiments, the thermally conductive fillers have a thermal conductivity of at least 1 W/mK (Watts per meter-Kelvin) or more, such as a copper filler having thermally conductivity up to several hundred W/mK, etc. Suitable thermally conductive fillers include, for example, zinc oxide, boron nitride, alumina, aluminum, graphite, ceramics, combinations thereof (e.g., alumina and zinc oxide, etc.). In addition, exemplary embodiments of a thermal interface material may also include different grades (e.g., different sizes, different purities, different shapes, etc.) of the same (or different) thermally conductive fillers. For example, a thermal interface material may include two different sizes of boron nitride. By varying the types and grades of thermally conductive fillers, the final characteristics of the thermal interface material (e.g., thermal conductivity, cost, hardness, etc.) may be varied as desired.

In alternative exemplary embodiments, the TIM1 may be a multilayered thermal interface material that may comprise a heat spreader (e.g., an interior heat spreading core formed from metal, metal alloy, graphite, sheet of stamped aluminum or copper, etc.) that is isotropic or anisotropic. The heat spreader may be disposed within or sandwiched between layers of a thermoplastic thermal interface material. Or, for example, a thermoplastic thermal interface material may be applied to (e.g., coated onto, etc.) the heat spreader on or along one or both sides.

The size of the TIM1 relative to the footprint of the heat source, e.g., component(s), to be cooled may vary depending on the particular application. The TIM1 may have a larger, smaller, or about equal footprint size as that of the footprint of the heat source, e.g., components, to be cooled. For example, the TIM1 may be initially sized such that it has a footprint smaller than that of the component footprint. But the TIM1 may be configured to have a have a greater initial thickness so that the volume of the TIM1 material is essentially the same as that of a thinner pad with a footprint about the same size as the component(s) to be cooled. When the TIM1 is heated to a temperature at which it become flowable, the TIM1 would flow to form a thin bond line as disclosed herein, which, in turn, would also increase the footprint of the TIM1.

The TIM1 may be applied using a variety of methods. For example, the TIM1 may be pre-applied to the integrated heat spreader or lid, thereby reducing the number of assembly steps. The TIM1 may be naturally tacky such that when pre-applied it will adhere to the heat spreader or lid without any additional adhesive needed (although adhesives could also be used). As another example, the heat spreader or lid may be preheated, and then the TIM1 may be pre-applied to the warm heat spreader or lid. The TIM1 may also be pre-applied to the component(s) to be cooled instead of the heat spreader or lid.

In another exemplary embodiment, the TIM1 may be added into or otherwise be present in a solvent. The solvent and TIM1 may be applied as a grease or dispensed material to a heat spreader or lid or to the one or more component(s) to be cooled. The assembly may then be put together, such as by adhesively attaching the heat spreader or lid to the PCB that includes the one or more components to be cooled. The solvent may then be allowed to slowly evaporate. After the solvent has evaporated, the TIM1 would remain, which would have a softening temperature above, within, or less than the normal operating temperature range of the one or more component(s). In this particular example, the softening or melting step of TIM1 during lid/heat spreader attachment would not be required in this example. Because the TIM1 is assembled at low viscosity, the TIM1 would fill voids and wet the surfaces.

In exemplary embodiments that include a TIM2, a wide variety of materials may be used for the TIM2. In exemplary embodiments, the TIM2 may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. In exemplary embodiments, the TIM2 may be configured to have sufficient conformability, compliability, and/or softness to allow the TIM2 material to closely conform to a mating surface when placed in contact with the mating surface, including a non-flat, curved, or uneven mating surface. By way of example, some exemplary embodiments include an electrically conductive soft thermal interface material formed from elastomer and at least one thermally-conductive metal, boron nitride, and/or ceramic filler, such that the soft thermal interface material is conformable even without undergoing a phase change or reflow. The TIM2 may include one or more of Tflex™ 300 series thermal gap filler materials, Tflex™ 600 series thermal gap filler materials, Tpcm™ 580 series phase change materials, Tpli™ 200 series gap fillers, and/or Tgrease™ 880 series thermal greases from Laird Technologies, Inc. of Saint Louis, Mo., and, accordingly, have been identified by reference to trademarks of Laird Technologies, Inc. Details on these different materials are available at www.lairdtech.com. Other thermally-conductive compliant materials or thermally-conductive interface materials can also be used for the TIM2. For example, the TIM2 may comprise graphite, a flexible graphite sheet, exfoliated graphite and/or compressed particles of exfoliated graphite, formed from intercalating and exfoliating graphite flakes, such as eGraf™ commercially available from Advanced Energy Technology Inc. of Lakewood, Ohio. Such intercalating and exfoliating graphite may be processed to form a flexible graphite sheet, which may include an adhesive layer thereon.

In some exemplary embodiments, a method of establishing a thermal joint for conducting heat between a heat spreader and a heat source of an electronic device generally includes positioning a thermal interface material (TIM1) between the heat spreader and the heat source. The thermal interface material may comprise a phase change thermal interface material having a softening temperature that is below or within a normal operating temperature range of the heat source. For example, the phase change thermal interface material may have a phase change temperature below or within the normal operating temperature range of the heat source. The phase change thermal interface material may also be shear thinning and thixotropic such that the phase change thermal interface material is not flowable at the phase change temperature except under pressure. In which case, the phase change thermal interface material may include the proper combination of particles, additives, and polymers that results in a material that maintains shape unless force is applied even when in its softened state. Also, for example, the phase change thermal interface material may comprise a phase change material (e.g., a silicone-free or silicone wax phase change material, phase change material having silicone additives, etc.) having a softening temperature range from about 45 degrees Celsius to about 70 degrees Celsius.

The phase change thermal interface material may have a phase change temperature above the normal operating temperature range of the heat source, such that the phase change thermal interface material softens, without melting, within the normal operating temperature range of the heat source. The method may include heating the phase change thermal interface material to a temperature above the normal operating temperature range, such that the phase change thermal interface material is flowable under pressure; and allowing the phase change thermal interface material to return to a temperature below or within the normal operating temperature range, whereby the phase change thermal interface material establishes a thermal joint between the heat spreader and the heat source. The method may include heating the phase change thermal interface material to a phase change temperature while under pressure such that the phase change thermal interface material flows to form a thin bond line between the heat spreader and the heat source; and allowing the phase change thermal interface material to return to a solid state, whereby the phase change thermal interface material establishes a thermal joint between the heat spreader and the heat source. The method may further include applying the phase change thermal interface material to the heat spreader before positioning the phase change thermal interface material between the heat spreader and the heat source; or applying the phase change thermal interface material to the heat source before positioning the phase change thermal interface material between the heat spreader and the heat source. The method may include curing an adhesive for attaching the heat spreader to the electronic device, which curing process also heats the phase change thermal interface material to at least the softening temperature.

In some exemplary embodiments, a method of establishing a thermal joint for conducting heat between a heat spreader and a heat source of an electronic device generally includes positioning a thermal interface material (TIM1) between the heat spreader and the heat source. Depending on the particular embodiment, the thermal interface material may be operable above, below, or within a normal operating temperature range of the heat source for reestablishing or restoring a thermal joint or thermal path after a loss of contact between the thermal interface material and another component (e.g., heat spreader, heat source, etc.) resulting in poor thermal transfer, etc. For example, if delamination of the thermal interface material occurs during thermal cycling, then interfacial contact resistance and thermal resistance of the thermal joint will increase whereby heat from the heat source will cause the thermal interface material to soften, reduce contact resistance, and rewet the surfaces. With time, the softened thermal interface material may then restore or reestablish the thermal joint and improve thermal transfer, e.g., back to the original thermal transfer, etc. As another example, small voids (e.g., voids created by outgassing, etc.) in the thermal interface material may become smaller and totally fill in when the thermal interface material is under pressure (e.g., constant pressure, etc.) over time.

In some exemplary embodiments, a method generally includes positioning a thermal interface material (TIM1) between a heat spreader and a heat source of an electronic device prior to curing an adhesive for attaching the heat spreader to the electronic device. The thermal interface material has a softening temperature that is below or within a normal operating temperature range of the heat source. The method may further include attaching the heat spreader to the electronic device by curing an adhesive. During the curing, the thermal interface material may be heated under pressure such that the thermal interface material flows to form a thin bond line between the heat spreader and the heat source. The method may also include allowing the thermal interface material to return to a solid state, whereby the thermal interface material establishes a thermal joint having low thermal resistance between the heat spreader and the heat source. The thermal interface material may be operable for reestablishing or restoring the thermal joint as described herein.

In a further exemplary embodiment, an electronic device generally includes a lid and a semiconductor device having a normal operating temperature range. A first thermal interface material (TIM1) establishes a restorable thermal joint between the lid and the semiconductor device. The first thermal interface material may comprise a phase change thermal interface material having a softening temperature that is below or within a normal operating temperature range, and/or the first thermal interface material may be operable for reestablishing or restoring the thermal joint between the lid and the semiconductor device. The electronic device may also include a heat sink. A second thermal interface material may be positioned between the lid and the heat sink. The semiconductor device may be in effective thermal communication with the heat sink via the first thermal interface material, the lid, and the second thermal interface material.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or, for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of establishing a thermal joint for conducting heat between a heat spreader and a heat source of an electronic device, the heat source having a normal operating temperature range, the method comprising:
    positioning a thermal interface material in an initial solid state between the heat spreader and the heat source, wherein the thermal interface material comprises a phase change thermal interface material; and
    heating the thermal interface material while under pressure to a temperature within a range such that the thermal interface material becomes flowable to form a thin bond line between the heat spreader and the heat source and establishes the thermal joint between the heat spreader and the heat source,
    whereupon removal of the pressure, the thermal interface material returns to the solid state and remains solidified as the thermal interface material precludes the heat source from heating beyond the normal operating temperature range during operation of the electronic device and heat is flowable through the thermal joint from the heat source to the heat spreader during operation of the electronic device whereby temperature of the heat source is reduced;
    wherein the phase change thermal interface material is not flowable at the temperature within the range except under pressure and such that the phase change thermal interface material maintains shape unless force is applied even when the phase change thermal interface material is at the temperature within the range.

2. The method of claim 1, wherein heating the thermal interface material while under pressure to a temperature within a range comprises heating the thermal interface material while under pressure to a temperature within a range from about 45 degrees Celsius to about 70 degrees Celsius.

3. The method of claim 2, wherein the phase change thermal interface material is not flowable at the temperature within the range from about 45 degrees Celsius to about 70 degrees Celsius except under pressure and such that the phase change thermal interface material maintains shape unless force is applied even when the phase change thermal interface material is at the temperature within the range from about 45 degrees Celsius to about 70 degrees Celsius.

4. The method of claim 1, wherein:
    the phase change thermal interface material is silicone free; and/or
    the phase change thermal interface material is shear thinning and thixotropic.

5. The method of claim 1, wherein the method includes positioning the thermal interface material in the initial solid state in the form of a pad between the heat spreader and the heat source.

6. The method of claim 1, wherein the thermal interface material has a shore 00 hardness of less than 80 at a temperature of 25 degrees Celsius.

7. The method of claim 1, wherein heating the thermal interface material while under pressure to a temperature within a range comprises heating the thermal interface material while under pressure to a temperature that is within or below the normal operating temperature range of the heat source.

8. The method of claim 1, wherein:
the normal operating temperature range of the heat source is within a range from about 30 degrees Celsius to about 60 degrees Celsius; and
heating the thermal interface material while under pressure to a temperature within a range comprises heating the thermal interface material while under pressure to a temperature that is within or below the normal operating temperature range of the heat source.

9. The method of claim 1, wherein:
the phase change thermal interface material is naturally tacky; and
the method further comprises pre-applying the phase change thermal interface material to the heat spreader, without using any additional adhesive between the phase change thermal interface material and the heat spreader, before positioning the phase change thermal interface material between the heat spreader and the heat source, such that the phase change thermal interface material adheres to the heat spreader without any additional adhesive.

10. The method of claim 1, wherein:
the electronic device comprises a semiconductor device having the heat source;
the heat spreader comprises a lid of the electronic device;
the phase change thermal interface material is positioned between the semiconductor device and the lid; and
the method further comprises positioning a second thermal interface material between a heat sink and the lid, whereby the semiconductor device is in effective thermal communication with the heat sink via the phase change thermal interface material, the lid, and the second thermal interface material.

11. The method of claim 1, wherein the method comprises:
positioning the thermal interface material between the heat spreader and the heat source prior to curing an adhesive for attaching the heat spreader to the electronic device;
attaching the heat spreader to the electronic device by curing the adhesive, whereby the heating the thermal interface material while under pressure to the temperature within the range is during the curing.

12. The method of claim 1, wherein:
the thermal interface material has an initial footprint smaller than a footprint of the heat source; and
the method includes increasing the footprint of the thermal interface material during the heating of the thermal interface material while under pressure to the temperature within the range.

13. A method of establishing a thermal joint for conducting heat between a heat spreader and a heat source of an electronic device, the heat source having a normal operating temperature range, the method comprising:

heating a thermal interface material in an initial solid state between the heat spreader and the heat source while under pressure to a temperature within a range such that the thermal interface material becomes flowable to form a thin bond line between the heat spreader and the heat source and establishes the thermal joint between the heat spreader and the heat source;
whereupon removal of the pressure, the thermal interface material returns to the solid state and remains solidified as the thermal interface material precludes the heat source from heating beyond the normal operating temperature range during operation of the electronic device and heat is flowable through the thermal joint from the heat source to the heat spreader during operation of the electronic device whereby temperature of the heat source is reduced.

14. The method of claim 13, wherein the method includes positioning the thermal interface material in the initial solid state in the form of a pad between the heat spreader and the heat source.

15. The method of claim 13, wherein the thermal interface material comprises a phase change thermal interface material that is not flowable at the temperature within the range except under pressure and such that the phase change thermal interface material maintains shape unless force is applied even when the phase change thermal interface material is at the temperature within the range.

16. The method of claim 15, wherein:
the phase change thermal interface material is silicone free; and/or
the phase change thermal interface material is shear thinning and thixotropic.

17. The method of claim 13, wherein heating the thermal interface material while under pressure to a temperature within a range comprises heating the thermal interface material while under pressure to a temperature within a range from about 45 degrees Celsius to about 70 degrees Celsius.

18. The method of claim 17, wherein the thermal interface material is not flowable at the temperature within the range from about 45 degrees Celsius to about 70 degrees Celsius except under pressure and such that the thermal interface material maintains shape unless force is applied even when the thermal interface material is at the temperature within the range from about 45 degrees Celsius to about 70 degrees Celsius.

19. The method of claim 13, wherein the thermal interface material has a shore 00 hardness of less than 80 at a temperature of 25 degrees Celsius.

20. The method of claim 13, wherein heating the thermal interface material while under pressure to a temperature within a range comprises heating the thermal interface material while under pressure to a temperature within or below the normal operating temperature range of the heat source and/or such that the thermal interface material becomes flowable to form the thin bond line having a thickness of about 10 mils or less between the heat spreader and the heat source.

* * * * *